(12) United States Patent
Zhang

(10) Patent No.: US 9,385,658 B2
(45) Date of Patent: Jul. 5, 2016

(54) FAST RECOVERY SCHEME OF TRANSCONDUCTANCE GAIN FOR FOLDED CASCODE AMPLIFIER

(71) Applicant: INTERSIL AMERICAS LLC, Milpitas, CA (US)

(72) Inventor: Xin Zhang, San Jose, CA (US)

(73) Assignee: INTERSIL AMERICAS LLC, Milpitas, CA (US)

( * ) Notice: Subject to any disclaimer, the term of this patent is extended or adjusted under 35 U.S.C. 154(b) by 0 days.

(21) Appl. No.: 14/569,693

(22) Filed: Dec. 13, 2014

(65) Prior Publication Data

US 2016/0056766 A1    Feb. 25, 2016

Related U.S. Application Data

(60) Provisional application No. 62/040,692, filed on Aug. 22, 2014.

(51) Int. Cl.
*H03F 3/45* (2006.01)
*H03F 1/02* (2006.01)

(52) U.S. Cl.
CPC ............ *H03F 1/0205* (2013.01); *H03F 1/0261* (2013.01); *H03F 3/45192* (2013.01); *H03F 2203/45028* (2013.01); *H03F 2203/45302* (2013.01); *H03F 2203/45396* (2013.01)

(58) Field of Classification Search
CPC .............. H03F 3/45; H03F 1/22; H03F 1/223
USPC .................................. 330/253, 261, 311, 292
See application file for complete search history.

(56) References Cited

U.S. PATENT DOCUMENTS

| | | | |
|---|---|---|---|
| 5,175,533 A | 12/1992 | Krenik | |
| 7,126,596 B1 * | 10/2006 | Hogan | ................ G09G 3/3688 345/208 |
| 2007/0159250 A1 * | 7/2007 | Tsuchi | ................ H03F 3/45233 330/253 |

OTHER PUBLICATIONS

Centurelli, Francesco et al. "A Low-Power Sample-and-Hold Circuit Based on a Switched-OpAmp Technique" ICSES 2008 International Conference on Signals and Electronic Systems. Sep. 14-17, 2008. pp. 105-108.

Dai, Liang et al. "CMOS Switched-Op-Amp-Based Sample-and-Hold Circuit" *IEEE Journal of Solid-State Circuits*. vol. 35, No. 1, Jan. 2000. pp. 109-113.

\* cited by examiner

*Primary Examiner* — Steven J Mottola
(74) *Attorney, Agent, or Firm* — Gary Stanford; Huffman Law Group, PC

(57) ABSTRACT

A folded cascode amplifier (FCA) including cascode stages coupled in a stacked cascode configuration, an input stage, and a switch circuit. The stages may include first and second P-type stages and first and second N-type stages, in which the first N-type stage and the input stage receive first and second bias voltages, respectively. The switch circuit couples a first cascode bias voltage to the second P-type stage and couples a second cascode bias voltage to the first N-type stage in a high power state, and decouples the first and second cascode bias voltages in a low power state. A non-switched low current bias generator provides the first and second bias and cascode bias voltages, which remain substantially stable in the low and high power states. Only low parasitic capacitance nodes are switched between power states so that the gain of the FCA recovers very quickly for the high power state.

20 Claims, 4 Drawing Sheets

US 9,385,658 B2

FAST RECOVERY SCHEME OF TRANSCONDUCTANCE GAIN FOR FOLDED CASCODE AMPLIFIER

CROSS-REFERENCE TO RELATED APPLICATIONS

This application claims the benefit of U.S. Provisional Application Ser. No. 62/040,692, filed on Aug. 22, 2014 which is hereby incorporated by reference in its entirety for all intents and purposes.

BRIEF DESCRIPTION OF THE DRAWINGS

The benefits, features, and advantages of the present invention will become better understood with regard to the following description and accompanying drawings, in which.

DETAILED DESCRIPTION

Folded cascode amplifiers (FCAs) are widely used in power management integrated circuits (ICs) for their close to rail input common-mode, high direct current (DC) gain and easy compensation. In battery power management applications, the analog building blocks are typically powered off during a low power state to extend battery life. The analog building blocks, however, should recover quickly when transitioning to high power state (e.g., normal state) in order to obtain good transient response. Recovery schemes are used to serve the purpose of transitioning between power states. Conventional recovery schemes have relatively long unsettled dynamic transconductance gain (GM) recovery times. Such long recovery times may be sufficient for some applications in which fast voltage gain recovery time is more important than transconductance gain recovery time, such as comparators, but are generally not acceptable for other applications in which transconductance gain recovery time plays an important role in the transfer function, such as buffers and error amplifiers.

Figure 1:
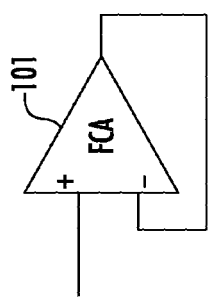
FIG. 1 is a simplified schematic diagram of a folded cascode amplifier (FCA) configured as an error amplifier having its output coupled a resistor-capacitor (RC) circuit.
Figure 2:
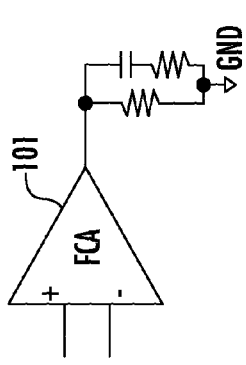
FIG. 2 is a simplified schematic diagram of the FCA configured as a buffer having its output coupled to its inverting input.

FIG. 1 is a simplified schematic diagram of a folded cascode amplifier (FCA) 101 configured as an error amplifier having its output coupled a resistor-capacitor (RC) circuit. FIG. 2 is a simplified schematic diagram of the FCA 101 configured as a buffer having its output coupled to its inverting input. Such applications are common in ICs with power management. In configurations with battery power management, the FCA 101 is configured to power down during a low power state to extend battery life. As described further herein, the FCA 101 is also configured to recover quickly from a low power state or from a powered down state, so that the FCA 101 has improved transient response compared to the conventional configurations.

Figure 3:
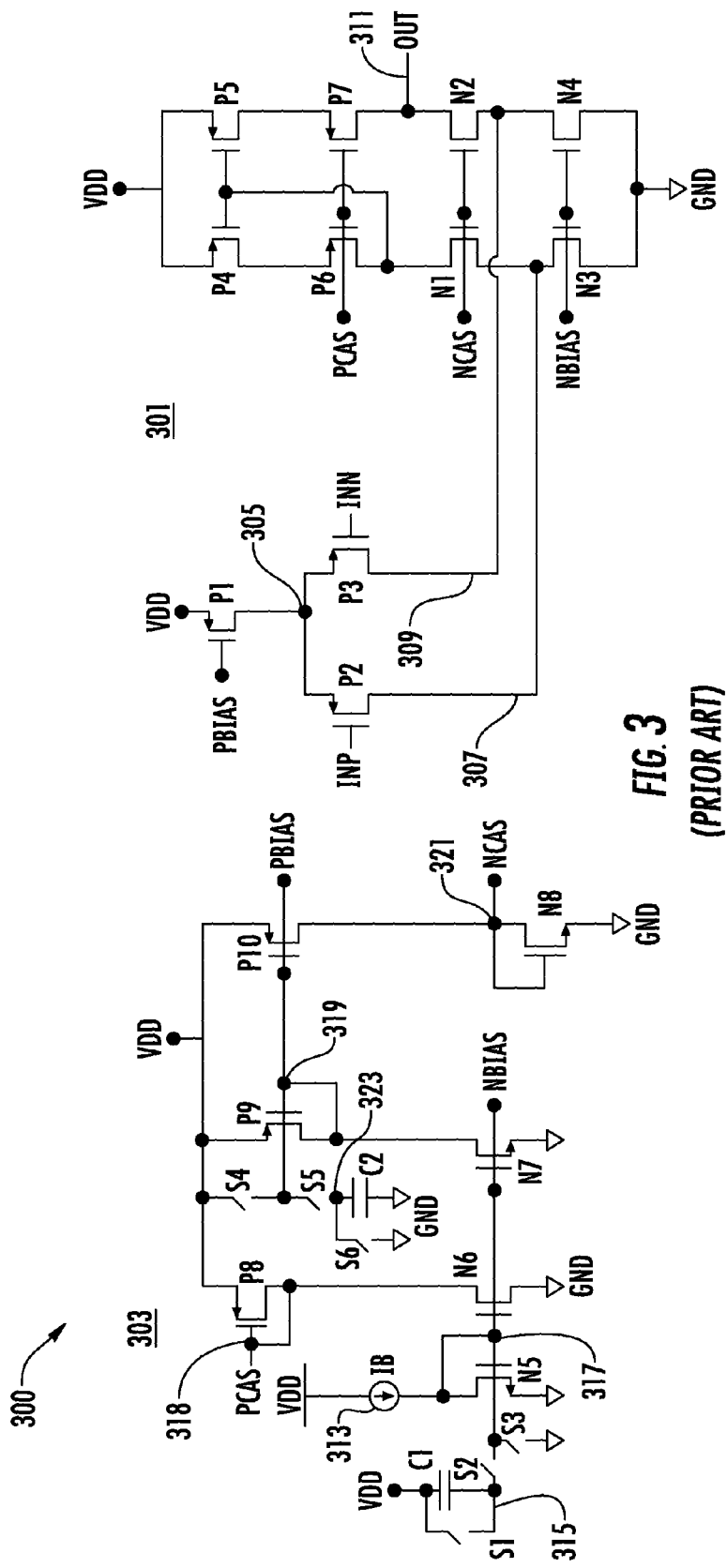
FIG. 3 is a schematic diagram of an FCA implemented with a conventional recovery scheme.

FIG. 3 is a schematic diagram of an FCA 300 implemented with a conventional recovery scheme. The FCA 300 includes an amplifier circuit 301 and a bias circuit 303. As used herein, each FCA 300 has an amplifier circuit configured as a folded cascode amplifier and a bias circuit that provides the bias voltages for the amplifier circuit. The amplifier circuit 301 includes P-type transistors P1, P2, P3, P4, P5, P6 and P7 and N-type transistors N1, N2, N3, and N4. P1 has its source coupled to a supply voltage VDD, its drain coupled to a node 305, and its gate receiving a bias voltage PBIAS. P2 and P3 each having their sources coupled to node 305. P2 has its drain coupled to node 307 and its gate receiving a non-inverting or positive input voltage INP. P3 has its drain coupled to a node 309 and its gate receiving an inverting or negative input voltage INN. INP and INN form the differential input voltages of the FCA 300.

As used herein, the P-type transistors may be P-type or P-channel MOS (PMOS) transistors or the like, and the N-type transistors may be N-type or N-channel MOS (NMOS) transistors or the like. Alternative transistor types are also contemplated, such as other types of field-effect transistor (FETs) or bipolar-junction transistors (BJTs) or the like.

P4, P5, P6 and P7 and N1, N2, N3 and N4 are coupled in a cascode configuration. As shown, P4 and P5 have their sources coupled to VDD. P4 has its drain coupled to the source of P6 and P5 has its drain coupled to the source of P7. The gates of P4 and P5 are coupled together and to the drain of P6. A bias voltage PCAS is provided to the gates of P6 and P7. The drain of P6 is coupled to the drain of N1, and the drain of P7 is coupled to the drain of N2. A bias voltage NCAS is provided to the gates of N1 and N2. The source of N1 is coupled to node 307, which is further coupled to the drain of N3. The source of N2 is coupled to node 309, which is further coupled to the drain of N4. The sources of N3 and N4 are coupled to a supply reference node, such as ground (GND). A bias voltage NBIAS is provided to the gates of N3 and N4. The drains of P7 and N2 are coupled together at an output node 311 providing an output signal OUT of the FCA 311.

The bias circuit 303 provides the bias voltages PBIAS, NBIAS, PCAS and NCAS to the amplifier circuit 301. The bias circuit 303 includes P-type transistors P8, P9, and P10, N-type transistors N5, N6, N7 and N8, capacitors C1 and C2, switches S1, S2, S3, S4, S5 and S6, and a current source 313 providing a bias current IB. S1 and C1 are coupled between VDD and a node 315, and S2 is coupled between node 315 and another node 317 developing the bias voltage NBIAS. S3 is coupled between node 317 and GND. Node 317 developing NBIAS is coupled to the gates of N5, N6 and N7. The current source 313 is configured to source the bias current IB to node 317. N5 has its drain coupled to its gate at node 317, and has its source coupled to GND. N6 has its drain coupled to a node 318 developing PCAS and its source coupled to GND. N7 has its drain coupled to a node 319 developing PBIAS, and has its source coupled to GND. N8 has its gate and drain coupled together at a node 321 developing NCAS, and has its source coupled to GND. P8, P9 and P10 each have their source coupled to VDD. P8 has gate and drain coupled together at node 318. P9 has its gate and drain coupled together at node 319. P10 has its gate coupled to node 319 and its drain coupled to node 321. S4 is coupled between VDD and node 319, S5 is coupled between nodes 319 and a node 323, and S6 and C2 are each coupled between node 323 and GND.

The FCA 300 is representative of various conventional configurations that may be used for applications with power management including battery applications and the like. The switches S1-S6 are used to switch between normal or "high" power state and a low power state to conserve power to extend battery life. In the illustrated configuration, the amplifier circuit 301 is not switched, but instead the bias circuit 303 is switched to transition between power states. The control signals provided to the switches S1-S6 are not shown, but generally each switch is in one of two states during the normal state and in the other state during the low power state. For example, in the normal or powered up state, switches S2 and S5 are on while the remaining switches are off, whereas during the low power or powered down state, switches S1, S3, S4 and S6 are on whereas switches S2 and S5 are off. Because of timing considerations between the switches S1-S6, however, multiple control signals must be used to transition between power states. In this manner, power transitioning has relatively complicated timing considerations for controlling the switches.

Figure 4:
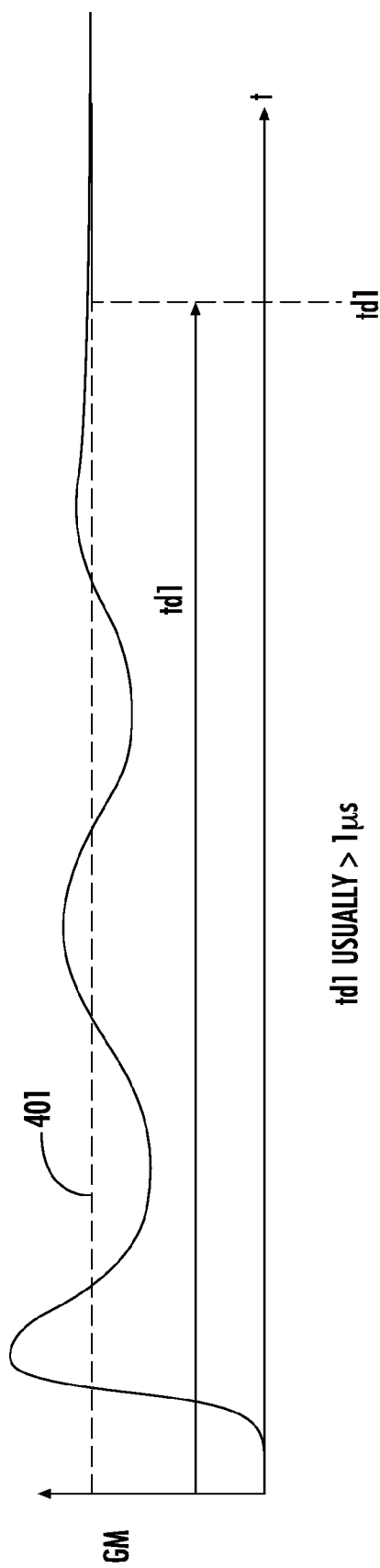
FIG. 4 is a timing diagram plotting transconductance gain GM of the FCA of FIG. 3 when transitioning from the low power state back to the normal operating state, such as during power on or reset (POR) or while re-activating the FCA of FIG. 1.

FIG. 4 is a timing diagram plotting transconductance gain GM of the FCA 300 when transitioning from the low power state back to the normal operating state, such as during power on or reset (POR) or while re-activating the FCA 300. A dashed line 401 represents the target value of GM during steady state. In order to establish at least a minimum level of gain of the FCA 300 in a relatively short amount of time, the current in each branch of the bias circuit 303 is relatively large during activation to speed up biasing during the power up transition. In one embodiment, for example, the current in each branch of the bias circuit 303 during activation may be on the order of hundreds of microamperes ($\mu A$) or the like so that the FCA 300 develops at least a minimum gain level relatively quickly. As shown in FIG. 3, however, the gain GM is not stable until after a delay time td1. For certain applications, such as comparators, the unstable transconductance gain GM is not problematic. For other applications, such as buffers and error amplifiers in which it is desired that the transconductance gain GM be stable, the long delay time for stabilizing GM is problematic.

The switches S1-S3 generally switch the bias voltage NBIAS and the switches S4-S6 generally switch the bias voltage PBIAS, so that the PBIAS and NBIAS voltages transition and thus change during power transitioning to the high power normal state. Parasitic capacitances associated with P1, N3, and N4 cause instability of the gain GM during activation or reactivation as shown in FIG. 3. In this manner, the gain GM does not stabilize until after the delay time td1. In one embodiment, td1 is a relatively long delay time, such as greater than 1 microsecond ($\mu s$) for a 0.13 micrometer ($\mu m$) process. It is desired to reduce the delay time in which the gain stabilizes.

Figure 5:
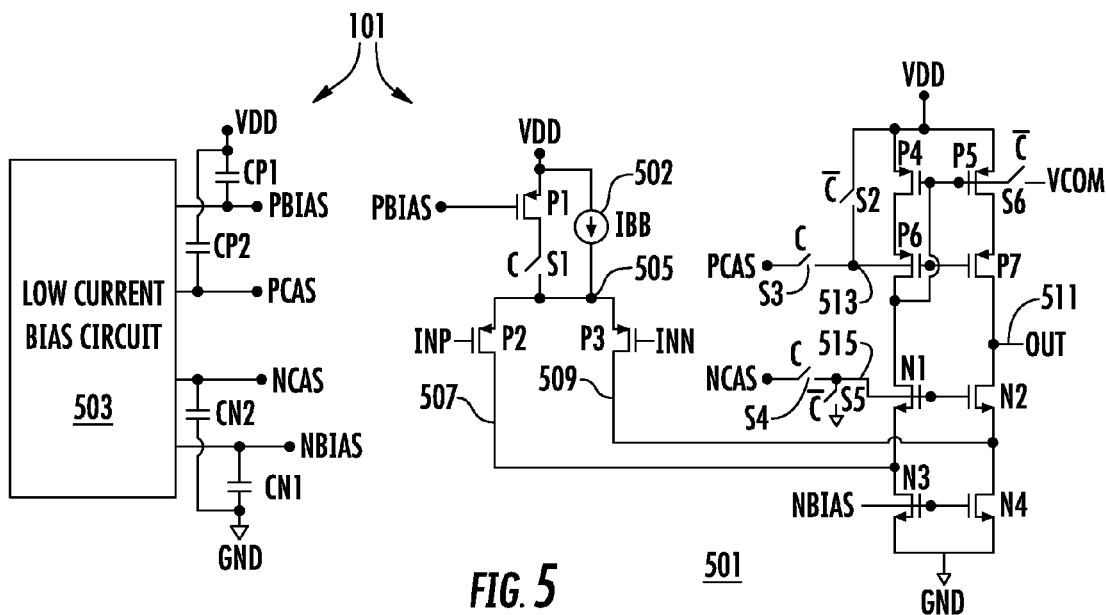
FIG. 5 is a schematic diagram of the FCA of FIG. 1 implemented according to one embodiment of the present invention.

FIG. 5 is a schematic diagram of the FCA 101 implemented according to one embodiment of the present invention. The FCA 101 includes an amplifier circuit 501 and a bias circuit 503. In a similar manner as the amplifier circuit 301, the amplifier circuit 501 also includes P-type devices P1-P7 and N-type devices N1-N4 coupled together in a similar manner with exceptions noted herein. Again, the P-type transistors may be P-type or P-channel MOS (PMOS) transistors or the like, and the N-type transistors may be N-type or N-channel MOS (NMOS) transistors or the like. Alternative transistor types are also contemplated, such as other types of field-effect transistor (FETs) or bipolar-junction transistors (BJTs) or the like. It is noted, however, that the P-type and N-type devices of the FCA 101 having the same name as those of the FCA 300 may be different devices even if of the same type or even of the same size. Also, nodes 305, 307, 309 and 311 are replaced by nodes 505, 507, 509 and 511, respectively.

The amplifier circuit 501 further includes a switch circuit and a current source 502 developing a bias current IBB. In the illustrated embodiment, the switch circuit includes switches S1, S2, S3, S4, S5 and S6, which are used to switch the amplifier circuit 501, and thus the FCA 101, between the higher power state and the low power state. S1 is coupled between the drain of P1 and node 505. S2 is coupled between VDD and a node 513. S3 is coupled between a bias voltage PCAS and node 513. S4 is coupled between a bias voltage NCAS and a node 515. S5 is coupled between node 515 and GND. S6 is coupled between the gates of P4 and P5 and a voltage VCOM. VCOM is a bias voltage selected to be close to the voltage level of the output OUT developed on node 511. The current source 502 sources a very small bias current IBB from VDD to node 505.

P1, P2, P3, the current source 502, and S1 collectively form an input stage for conveying the differential input voltages INP and INN to the cascode portion of the amplifier circuit. P1 receives PBIAS, in which the bias circuit 503 maintains PBIAS at a substantially stable voltage level between power states. P2 and P3 are the input devices of the input stage that receive the differential input voltages INP and INN. P4 and P5 form a first or upper P-type stage of the amplifier circuit 501 coupled to the upper supply voltage VDD. P6 and P7 form a second P-type stage cascoded with the first stage and receiving the PCAS bias voltage during the high power state. The switch S3 selectively provides PCAS to the second P-type stage between power states. N1 and N2 form a first N-type cascode stage coupled to the second P-type cascode stage forming the output node 511 and receiving the NCAS bias voltage during the high power state. The switches S4 and S5 selectively couple NCAS or GND to the first N-type cascode stage between power states. N3 and N4 form the last or second N-type stage coupled between the first N-type cascode stage and the lower supply voltage GND and biased with NBIAS. The bias circuit 503 also maintains NBIAS at a substantially stable voltage level between power states.

The switches S1-S6 are each controlled by a control signal C or its inverted version $\overline{C}$. As shown, switches S1, S3, and S4 are controlled by C, and switches S2, S5 and S6 are controlled by $\overline{C}$. In order to transition to the high power state, C is asserted high to logic one to close those switches controlled by C, whereas $\overline{C}$ is asserted low to logic zero to open those switches controlled by $\overline{C}$. C goes low and $\overline{C}$ goes high to transition to the low power state. In this manner, a single control signal may be developed for transitioning between power states with at least one inverter for providing $\overline{C}$, and there are no complicated timing requirements for controlling the switches S1-S6.

The bias circuit 503 is very low current. The bias circuit 503 does not need to be switched and thus does not include switches, so that it remains on even during the low power state. In the conventional schemes, recovery is focused on speeding up biasing so that a large bias current was needed. As described further herein, the bias circuit 503 is sourced by a very low bias current, such as about 100 times less that IB of the FCA 300. In this manner, the bias circuit 503 is very low power in comparison.

The amplifier circuit 501 includes the switches S1-S6 for switching between the power states. The switches S1-S6, however, do not switch the bias voltages PBIAS and NBIAS, but instead switch PCAS and NCAS. PCAS and NCAS are coupled to intermediate transistors P6, P7, N1 and N2, which are substantially smaller than the transistors P1, P4, P5, N3 and N4. In this manner, switching is associated with much smaller parasitic capacitances of much smaller devices, and not the parasitic capacitances of the larger devices including P1, N3 and N4. It is noted that the transistors P2 and P3 form a differential pair, in which a "tail current" is a current that is fed to the sources of P2 and P3 during operation. The switch S1, when opened, reduces the tail current in the low power or power down mode.

In this manner, since the bias circuit 503 does not switch PBIAS and NBIAS and the amplifier circuit 501 also does not directly switch these bias voltages, the PBIAS and NBIAS voltages remain substantially stable and unmodified during switching. Thus, the nodes associated with the larger parasitic capacitances remain relatively stable during the recovery process to the higher power state. Only the nodes associated with smaller parasitic capacitances are switched. A capacitor CP1 is coupled between PBIAS and VDD, another capacitor CP2 is coupled between PCAS and VDD, another capacitor CN1 is coupled between NBIAS and GND, and another capacitor CN2 is coupled between NCAS and GND. The capacitors CP1, CP2, CN1 and CN2 further enhance stability in that any small glitches that might otherwise occur on PBIAS, NBIAS, PCAS and NCAS are further reduced for increased stabilization.

Figure 6:
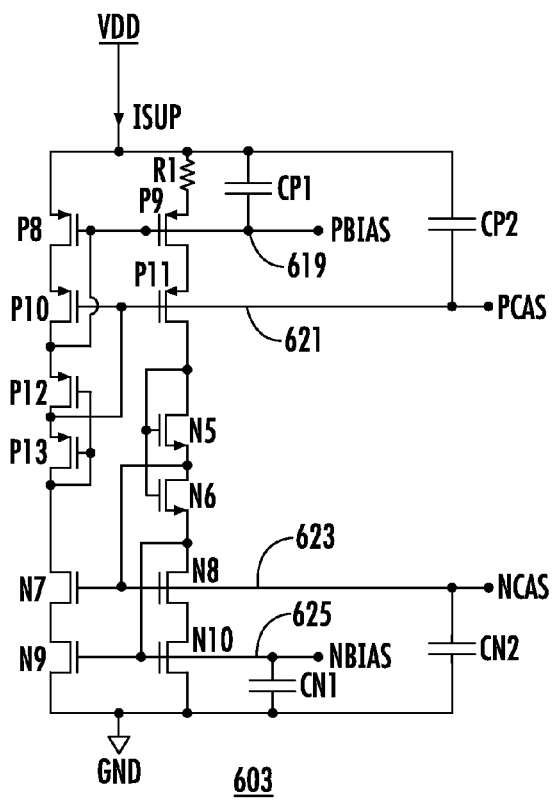
FIG. 6 is a more detailed schematic diagram of a low current bias circuit according to one embodiment which may be used as the bias circuit of FIG. 5.

FIG. 6 is a more detailed schematic diagram of a low current bias circuit 603 according to one embodiment which may be used as the bias circuit 503. The bias circuit 603 includes P-type devices P8-P13, N-type devices N5-N10, a resistor R1, and capacitors CP1, CP2, CN1 and CN2. A bias current ISUP is provided from VDD to the circuit. P8 has its source coupled to VDD and its gate coupled to a node 619 developing the bias voltage PBIAS. R1 is coupled between VDD and the source of P9, having its gate coupled to node 619. CP1 is coupled between VDD and node 619 for holding PBIAS stable. The drain of P8 is coupled to the source of P10, having its gate coupled to a node 621 developing the bias voltage PCAS. The drain of P9 is coupled to the source of P11, having its gate coupled to node 621. CP2 is coupled between VDD and node 621 for holding PCAS stable. The drain of P10 is coupled to node 619, which is further coupled to the source of P12. The gates of P12 and P13 are coupled together. The drain of P12 and the source of P13 are also coupled together at node 621. The gate and drain of P13 are coupled together and to the drain of N7. The drain of P11 is coupled to the drain of N5 and to the gates of N5 and N6. The source of N5 and the drain of N6 are coupled together at a node 623 developing NCAS. CN2 is coupled between node 623 and GND for holding NCAS stable. The source of N6 and the drain of N8 are coupled together at a node 625 developing NBIAS. CN1 is coupled between node 625 and GND for holding NBIAS stable. The gates of N7 and N8 are also coupled together at node 623. The gates of N9 and N10 are also coupled together at node 625. The source of N7 is coupled to the drain of N9, and the source of N8 is coupled to the drain of N10. The sources of N9 and N10 are coupled to GND.

The bias current ISUP consumed by low current bias circuit 603 is substantially smaller than the current consumed by the bias circuit 303 according to the conventional configuration. In one embodiment, ISUP is less than 1 μA, which is about 100 times smaller than the current consumed by the FCA 300 at the normal state. In this manner, the bias circuit 603 is very low power in comparison. Also, the bias circuit 603 does not include any switches and remains on in during the low power state. Since the bias circuit 603 draws a very low amount of current, it draws a very low amount of power.

Figure 7:
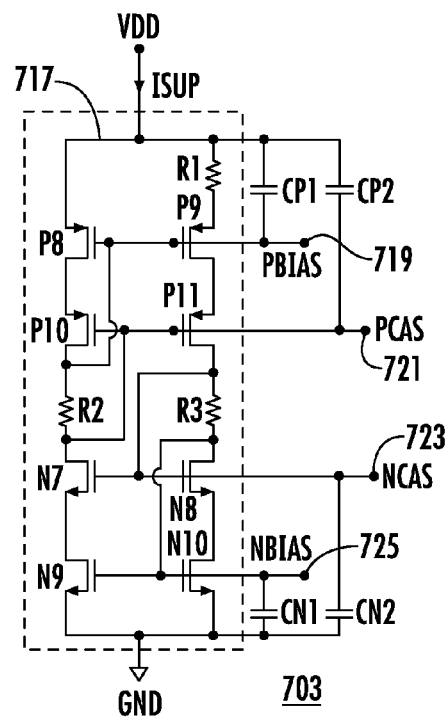
FIG. 7 is a more detailed schematic diagram of a low current bias circuit according to another embodiment which may be used as the bias circuit of FIG. 5.

FIG. 7 is a more detailed schematic diagram of a low current bias circuit 703 according to another embodiment which may be used as the bias circuit 503. The bias circuit 703 is similar to the bias circuit 603 except that it replaces a few of the intermediate P-type devices with resistors. The bias circuit 703 includes P-type devices P8-P11, N-type devices N7-N10, resistors R1-R3, and the capacitors CP1, CP2, CN1 and CN2. The bias circuit 703 includes an upper bias node 717 coupled directly to VDD for providing the bias current ISUP. P8 has its source coupled to node 717 and its gate coupled to a node 719 developing the bias voltage PBIAS. R1 is coupled between node 717 and the source of P9, having its gate coupled to node 719. CP1 is coupled between nodes 717 and 719 for holding PBIAS stable. The drain of P8 is coupled to the source of P10, having its gate coupled to a node 721 developing the bias voltage PCAS. The drain of P9 is coupled to the source of P11, having its gate coupled to node 721. CP2 is coupled between nodes 717 and 721 for holding PCAS stable. The drain of P10 is coupled to node 719 and to one end of R2. The other end of R2 is coupled to node 721 and to the drain of N7. The drain of P11 is coupled to one end of R3 and to node 723 developing NCAS. The other end of R3 is coupled to the drain of N8 and to a node 725 developing NBIAS. CN2 is coupled between node 723 and GND for holding NCAS stable, and CN1 is coupled between node 725 and GND for holding NBIAS stable. The gates of N7 and N8 are coupled to node 723. The source of N7 is coupled to the drain of N9, and the source of N8 is coupled to the drain of N10. The gates of N9 and N10 are coupled together at node 725, and the sources of N9 and N10 are coupled to GND.

The bias current ISUP is substantially smaller than the bias current needed for the conventional configuration. In one embodiment, ISUP is less than 1 μA, which is about 100 times smaller than the current consumed by the FCA 300 at normal state. In this manner, the bias circuit 703 is very low power in comparison. Also, the bias circuit 703 does not include any switches and remains on in during the low power state. Since the bias circuit 703 draws a very low amount of current, it draws a very low amount of power.

Figure 8:
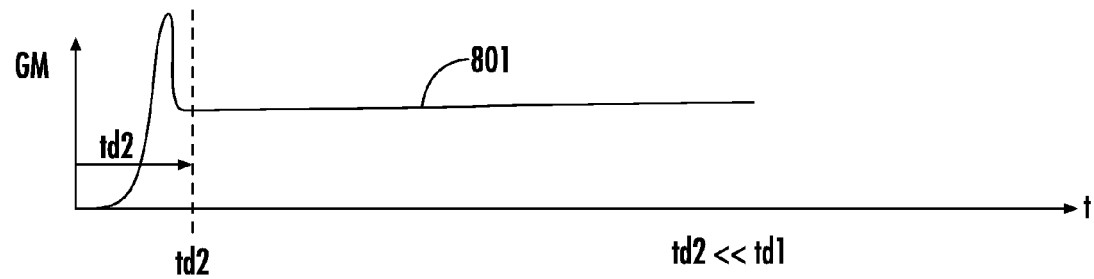
FIG. 8 is a timing diagram plotting transconductance gain GM of the FCA of FIG. 1 when transitioning from the low power state back to the high power normal state, such as during POR or while re-activating the FCA of FIG. 1.

FIG. 8 is a timing diagram plotting transconductance gain GM of the FCA 101 when transitioning from the low power state back to the high power normal state, such as during POR or while re-activating the FCA 101. As shown in FIG. 8, the gain GM rises to an initial peak level and then quickly settles to its target value (shown at 801) after only a relatively small delay time td2. In this manner, there is little overshoot and substantially no undershoot so that GM stabilizes very quickly. The delay td2 is much smaller than td1, such as less than $1/10^{th}$ of td1. In one embodiment, td2 may be as short as 30 nanoseconds (ns) with a 0.13 micrometer (μm) process. The fast recovery time of the gain GM provides a substantial advantage for certain applications, such as the buffer and error amplifier shown in FIGS. 1 and 2.

A fast recovery scheme as described herein may be applied to any P-type or N-type input or to any folded cascode amplifier configuration. A fast recovery scheme as described herein may also be used in any other transconductance amplifier design.

Figure 9:
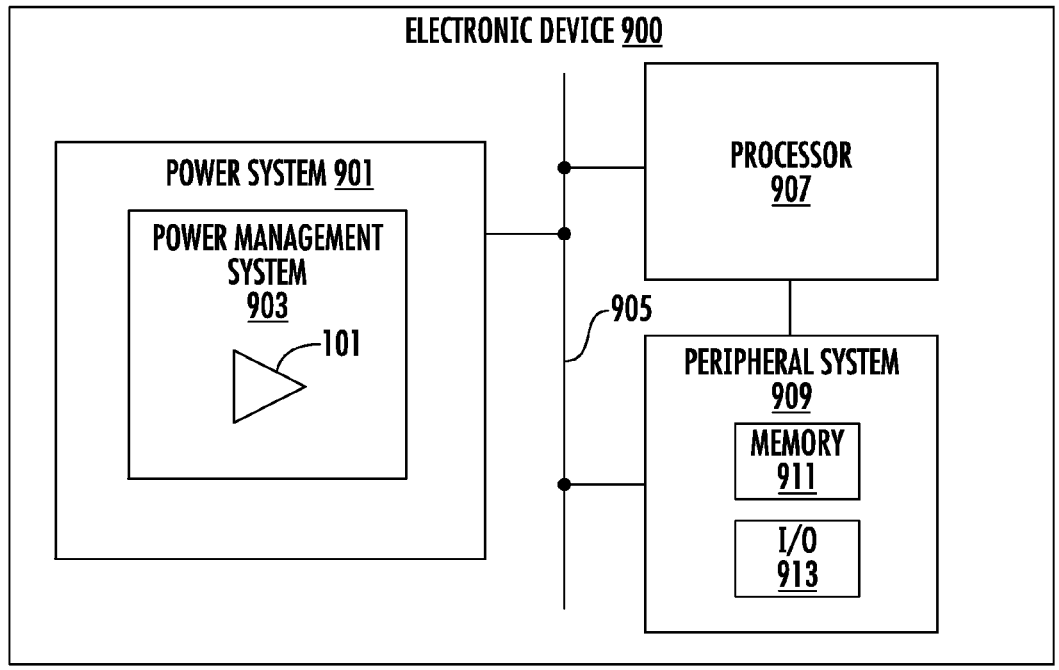
FIG. 9 is a simplified block diagram of an electronic device configured with a power system including a power management system including the FCA of FIG. 1 implemented according to any one of the embodiments of the present invention.

FIG. 9 is a simplified block diagram of an electronic device 900 configured with a power system 901 including a power management system 903 including the FCA 101 implemented according to any one of the embodiments of the present invention. The power system 901 develops one or more supply voltages which provide power to other system devices of the electronic device 900. In the illustrated embodiment, the electronic device 900 includes a processor 907 and a peripheral system 909, both coupled to receive supply voltages from the power system 901 via a supply bus 905, which includes any combination of power and/or signal conductors. In the illustrated embodiment, the peripheral system 909 may include any combination of a system memory 911, such as any combination of random-access memory (RAM) and/or read-only memory (ROM) type devices and memory controllers and the like, and an input/output (I/O) system 913, which may include system and peripheral controllers and the like, such as graphic controllers, interrupt controllers, keyboard and mouse controllers, system storage device controllers (e.g., controllers for hard disk drives and the like), etc. The illustrated system is exemplary only, since many of the processor system and support devices may be integrated onto the processor chip as understood by those skilled in the art.

The power management system 903 may be implemented as a power management chip or the like incorporating one or more folded cascode amplifiers 101. One or more FCAs 101 may be implemented as an amplifier, such as an error amplifier for developing an error or compensation signal or the like, or as any transconductance amplifier generating output current based on input voltage. One or more FCAs 101 may be implemented as a buffer or the like.

The electronic device 900 may be any type of computer or computing device, such as a computer system (e.g., notebook computer, desktop computer, netbook computer, etc.), a media tablet device (e.g., iPad by Apple Inc., Kindle by Amazon.com, Inc., etc.), a communication device (e.g., cellular phone, smartphone, etc.), among other types of electronic devices (e.g., media player, recording device, etc.). The power system 903 may be configured to include a battery, such as a rechargeable battery or the like (not shown) and may be configured to operate with an AC/DC adapter (not shown) or the like. The FCA 101 provides the advantage of being powered up and down quickly and having fast recovery of transconductance gain when transitioned back to the high power state from the low power state.

The benefits, features, and advantages of the present invention are now better understood with regard to the foregoing description and accompanying drawings. The foregoing description was presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed. Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention as defined by the following claim(s).

The invention claimed is:

1. An electronic device, comprising:
   a folded cascode amplifier, comprising:
      first and second P-type stages and first and second N-type stages, wherein said second N-type stage receives a first bias voltage;
      an input stage receiving a second bias voltage;
      wherein said first P-type stage is coupled between an upper supply voltage and said second P-type stage, wherein said second P-type stage is coupled between said first P-type stage and said first N-type stage, wherein said first N-type stage is coupled between said second P-type stage and said second N-type stage, wherein said second N-type stage is coupled between said first N-type stage and a lower supply voltage, and wherein said input stage is coupled between said upper supply voltage and said second N-type stage; and
      a switch circuit that couples a first cascode bias voltage to said second P-type stage and couples a second cascode bias voltage to said first N-type stage in a high power state, and that decouples said first cascode bias voltage from said second P-type stage and decouples said second cascode bias voltage from said first N-type stage in a low power state;
      wherein said first and second bias voltages and said first and second cascode bias voltages remain substantially stable in said low and high power states.

2. The electronic device of claim 1, wherein said switch circuit further connects a third bias voltage to said first P-type stage in said low power state and disconnects said third bias voltage from said first P-type stage in said high power state.

3. The electronic device of claim 1, wherein said input stage comprises:
   a bias device coupled between said upper supply voltage and an input node and receiving said first bias voltage; and
   a pair of input devices that receive a differential input voltage and that are coupled between said input node and said second N-type stage; and
   wherein said switch circuit connects said bias device to said input node in said high power state and disconnects said bias device from said input node in said low power state.

4. The electronic device of claim 3, wherein said input stage further comprises a current source providing a bias current to said input node.

5. The electronic device of claim 1, further comprising a non-switched bias generator that consumes a very low bias current and that provides and maintains stability of said first and second bias voltages and said first and second cascode bias voltages in both of said low and high power states.

6. The electronic device of claim 1, wherein said N-type stage and said input stage have high parasitic capacitances, and wherein said second P-type stage and said first N-type stage have low parasitic capacitances.

7. The electronic device of claim 1, wherein:
   said first P-type stage comprises:
      a first P-type transistor having a source coupled to said upper supply voltage, having a gate coupled to a first node, and having a drain; and a second P-type transistor having a source coupled to said upper supply voltage, having a gate coupled to said first node, and having a drain;

wherein said second P-type stage comprises:
    a third P-type transistor having a source coupled to said drain of said first P-type transistor, having a gate coupled to a second node, and having a drain coupled to said first node; and
    a fourth P-type transistor having a source coupled to said drain of said second P-type transistor, having a gate coupled to said second node, and having a drain coupled to an output node; and wherein said switch circuit comprises:
    a first switch that connects a third bias voltage to said first node in said low power state and that disconnects said third bias voltage from said first node in said low power state;
    a second switch that couples said first cascode bias voltage to said second node in said high power state and that decouples said first cascode bias voltage from said second node in said low power state; and
    a third switch that decouples said second node from said upper supply voltage in said high power state and that couples said second node to said upper supply voltage in said low power state.

8. The electronic device of claim 7, wherein:

said first N-type stage comprises:
    a first N-type transistor having a drain coupled to said first node, having a gate coupled to a third node, and having a source coupled to a first fourth node; and
    a fourth N-type transistor having a drain coupled to said output node, having a gate coupled to said third node, and having a drain coupled to a fifth node; and wherein said second N-type stage comprises:
    a third N-type transistor having a source coupled to said lower supply voltage, having a gate coupled to a sixth node, and having a drain coupled to said fourth node; and
    a fourth N-type transistor having a source coupled to said lower supply voltage, having a gate coupled to said sixth node, and having a drain coupled to said fifth node;

wherein said switch circuit comprises:
    a fourth switch that couples said second cascode bias voltage to said third node in said high power state and that decouples said second cascode bias voltage from said third node in said low power state; and
    a fifth switch that decouples said third node from said lower supply voltage in said high power state and that couples said third node to said lower supply voltage in said low power state.

9. The electronic device of claim 8, wherein:

said input stage comprises:
    a fifth P-type transistor having a source coupled to said upper supply voltage, having a gate receiving said first bias voltage, and having a drain;
    a sixth P-type transistor having a source coupled to an input node, having a gate receiving a first input voltage, and having a drain coupled to said fourth node;
    a seventh P-type transistor having a source coupled to said input node, having a gate receiving a second input voltage, and having a drain coupled to said fifth node; and
    a current source providing a bias current to said input node; and wherein said switch circuit comprises a sixth switch that couples said drain of said fifth P-type transistor to said input node in said high power state and that decouples said drain of said fifth P-type transistor from said input node in said low power state.

10. The electronic device of claim 1, further comprising:
    a first capacitor coupled between said first bias voltage and an upper bias node; and
    a second capacitor coupled between said second bias voltage and said lower supply voltage.

11. The electronic device of claim 1, further comprising:
    a third capacitor coupled between said first cascode bias voltage and said upper bias node; and
    a fourth capacitor coupled between said second cascode bias voltage and said lower supply voltage.

12. The electronic device of claim 1, wherein said folded cascode amplifier is incorporated within a power management system coupled to a processor and a memory.

13. The electronic device of claim 1, wherein said folded cascode amplifier comprises an error amplifier of a power management device.

14. A method of switching a folded cascode amplifier between low and high power states for fast recovery of gain, the folded cascode amplifier comprising first and second P-type stages and first and second N-type stages coupled in a cascoded stack configuration between an upper supply voltage and a lower supply voltage and an input stage coupled between the upper supply voltage and the second N-type stage, said method comprising:
    providing a stable first bias voltage to the input stage;
    providing a stable second bias voltage to bias the second N-type stage;
    providing a stable first cascode bias voltage and a stable second cascode bias voltage;
    coupling the first cascode bias voltage to bias the second P-type stage in the high power state, and decoupling the first cascode bias voltage from the second P-type stage in the low power state; and
    coupling the second cascode bias voltage to bias the first N-type stage in the high power state, and decoupling the second cascode bias voltage from the first N-type stage in the low power state.

15. The method of claim 14, further comprising connecting a third bias voltage to bias the first P-type stage in the lower power state, and disconnecting the third bias voltage from the first P-type stage in the high power state.

16. The method of claim 14, further comprising coupling the second P-type stage to the upper supply voltage and coupling the first N-type stage to the lower supply voltage in the low power state.

17. The method of claim 14, wherein the input stage comprises a bias device receiving the first bias voltage and coupled between the upper supply voltage and an input node and first and second input devices coupled between the input node and the second N-type stage, wherein said method further comprises connecting the bias device to the input node in the high power state, and disconnecting the bias device from the input node in the low power state.

18. The method of claim 17, further comprising providing a low bias current to the input node.

19. The method of claim 14, wherein said providing a stable first bias voltage, providing a stable second bias voltage, providing a stable first cascode bias voltage, and providing a stable second cascode bias voltage comprise providing the first and second bias voltages and the first and second cascode bias voltages from a non-switched bias generator that maintains stability of the first and second bias voltages and the first and second cascode bias voltages in both of the low and high power states.

20. The method of claim 19, further comprising sourcing the non-switched bias generator with a current source providing a low bias current.

\* \* \* \* \*